United States Patent [19]
Hellberg

[11] Patent Number: 6,094,458
[45] Date of Patent: Jul. 25, 2000

[54] ARRANGEMENTS AND METHODS FOR GENERATING A RADIO FREQUENCY SIGNAL

[75] Inventor: Richard Hellberg, Forellvägen, Sweden

[73] Assignee: Telefonaktiebolaget LM Ericsson, Stockholm, Sweden

[21] Appl. No.: 08/924,824

[22] Filed: Sep. 5, 1997

[30] Foreign Application Priority Data

Sep. 6, 1996 [SE] Sweden .................................. 9603256

[51] Int. Cl.$^7$ .................................................. H04B 14/04
[52] U.S. Cl. ........................... 375/242; 375/244; 375/296; 341/143; 364/724.04
[58] Field of Search ...................................... 375/244–252, 375/242, 243, 295, 296; 341/71, 143; 364/724.04

[56] References Cited

U.S. PATENT DOCUMENTS

| | | | |
|---|---|---|---|
| 5,157,343 | 10/1992 | Voorman .................................. | 329/319 |
| 5,401,953 | 3/1995 | Spencer et al. . | |
| 5,469,475 | 11/1995 | Voorman .................................. | 375/247 |
| 5,530,722 | 6/1996 | Dent et al. . | |
| 5,617,058 | 4/1997 | Adrian et al. .............................. | 330/10 |
| 5,701,106 | 12/1997 | Pikkarainen et al. .................... | 332/100 |
| 5,734,683 | 3/1998 | Hulkko et al. ............................ | 375/316 |
| 5,821,891 | 10/1998 | Shi et al. .................................. | 341/143 |

FOREIGN PATENT DOCUMENTS

0426560 A1  5/1991  European Pat. Off. .

OTHER PUBLICATIONS

D.P. Meyer, "A Multicarrier Feed–Forward Amplifier Design," Microwave Journal, pp. 78–88, Oct. 1994.

A. Bateman et al., Linear Transceiver Architectures, IEEE Vehicular Technologoy Conference, pp. 478–484, 1988.

K.Y. Chan et al., Liner Modulators Based on RF Synthesis: Realization and Analysis, IEEE Transactions on Circuits and Systems: Fundamental Theory and Applications, vol. 42, No. 6, Jun. 1995.

V.F. Dias et al., "Sigma–Delta Modulators for High–Resolution and Wide–Band A/D Converter Applications", Microelectronics Journal, pp. 253,277, 1994.

V.F. Dias, "Complex–Signal Sigma–Delta Modulators for Quadrature Bandpass A/D Conversion," Microelectronics Journal, vol. 27, No. 6, pp. 505–524, 1996.

K. Cardwell et al., Progress in UWB Generation with Linear Silicon Switches Optically Activated Switching III, SPIE, vol. 1873, pp. 238–248, 1993.

R. Mason et al., "High Speed, High Resolution Analogue–to–Digital Conversion Using a Hybrid Electro–Optic Approach, " IEEE International Symposium on Circuits and Systemns, pp. 704–707, 1995.

A. Rosen, "Long Lifetime Silicon Photoconductive Semiconductor Switches," Optically Activated Switching III, SPIE, vol. 1873, pp. 27–38, 1993.

International Search Report for SE 96/01201 Jul. 8, 1997.

*Primary Examiner*—Chi H. Pham
*Assistant Examiner*—Bryan Webster
*Attorney, Agent, or Firm*—Burns, Doane, Swecker & Mathis, L.L.P.

[57] ABSTRACT

The present invention relates to arrangements and methods for radio frequency modulation and power amplification of an information signal ($X_{IF}$). Modulation and amplification of the information signal ($X_{IF}$) is carried out with very high linearity and efficiency over a wide frequency band by sigma-delta modulating (410) said information signal ($X_{IF}$), whereby a digital signal (Y) is generated. The digital signal (Y) is up-mixed and voltage switched (420) by voltage-fed switches (423) controlled by the up-mixed digital signal (RF). Said switches are preferably conductive elements whose electric conductivity depend on the amount of ionising radiation that falls on the elements.

20 Claims, 9 Drawing Sheets

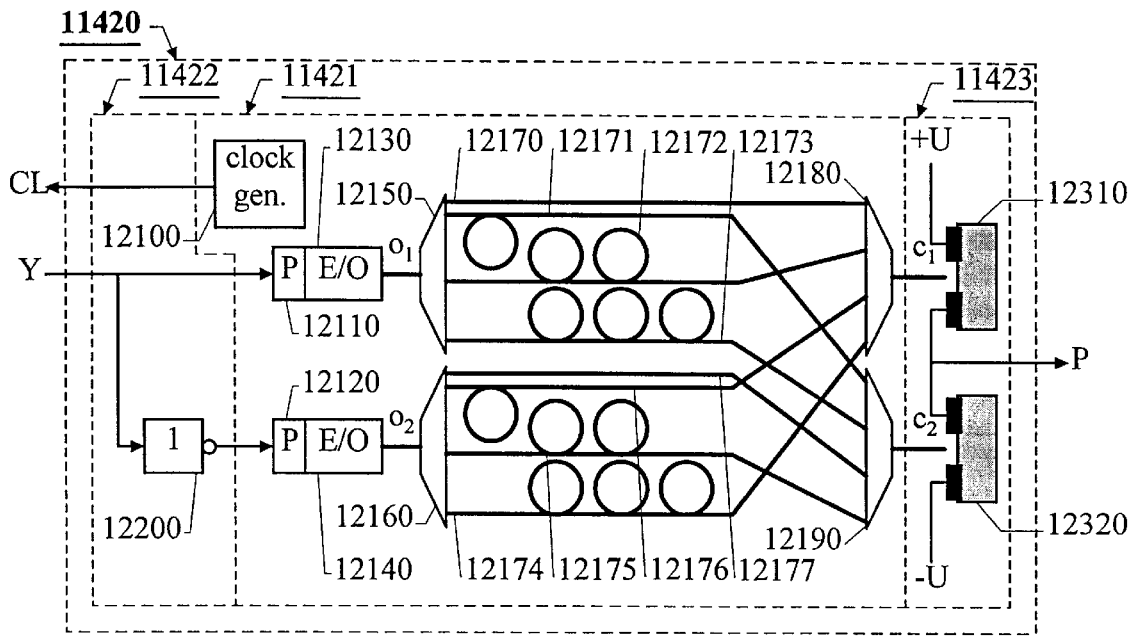
Fig. 12
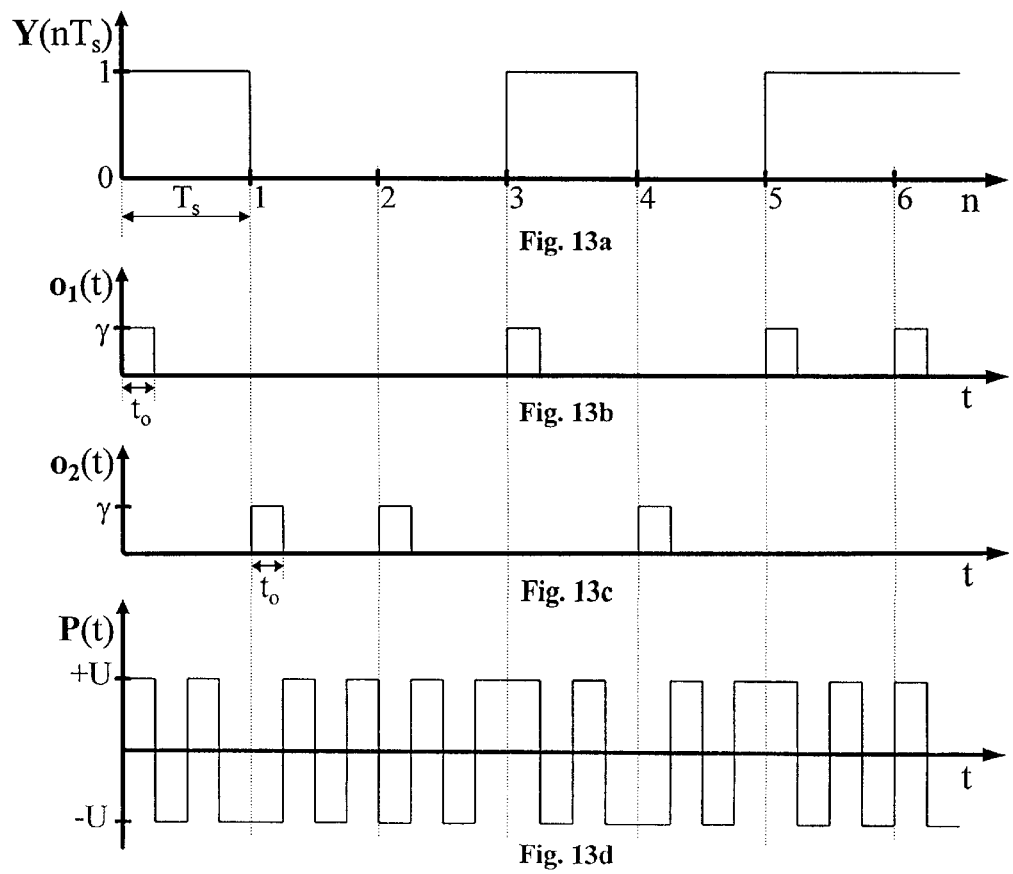
Fig. 13a
Fig. 13b
Fig. 13c
Fig. 13d

ARRANGEMENTS AND METHODS FOR GENERATING A RADIO FREQUENCY SIGNAL

FIELD OF INVENTION

The present invention relates to arrangements for modulation and power amplification of low frequency or intermediate frequency information signals to a radio frequency signal, wherein high linearity and high efficiency are achieved simultaneously over a wide frequency band. Seen generally, the invention relates to arrangements for the modulation and power amplification of an M-ary digital signal, i.e. a signal which includes M-number of different discrete signal values where M is an integer greater than or equal to two.

The invention also relates to methods that are applied with such arrangements.

DESCRIPTION OF THE BACKGROUND ART

In traditional power amplification of radio frequency signals, it is necessary, in principle, to choose either between a high efficiency or high linearity. For instance, a class C-type amplifier provides high efficiency while the linearity is insufficient for broadband applications for instance, whereas a class A-type amplifier is relatively linear but has low efficiency.

When using one and the same amplifier for the simultaneous amplification of several information signals modulated on different carrier waves, or when using linear modulation formats, such as QAM (QAM=Quadrature Amplitude Modulation) for instance, there is required a power amplifier whose linearity is extremely high, since it is essential in such cases that all the phase and amplitude positions of ingoing signal components are maintained in the amplification process. Otherwise, intermodulation can occur between the signal components and/or the spectrum of the amplified summation signal can be broadened so as to manifest the risk of interference with signals transmitted via other channels. Amplifiers that are adapted for simultaneous power amplification of a plurality of narrow band channels, and power amplifiers that are intended to amplify a carrier wave on which several CDMA channels CDMA=(Code Division Multiple Access) are superimposed are examples of equipment on which the aforesaid high linearity requirement is placed.

D. P. Myer investigates how a high bandwidth linear power amplifier can be obtained in his article "A Multicarrier Feed-Forward Amplifier Design", Microwave Journal, October 1994, pp. 78–88. The forward feed of the input signal to the power amplifier enables certain non-linearities to be compensated for.

In the article "Linear Transceiver Architectures", 1988 IEEE Vehicular Technology Conference, pp. 478–484, A. Bateman, et al, disclose how power amplifiers having high linearity can be obtained alternatively with the aid of cartesian feedback, the LINC principle all adaptive predistortion (LINC=Linear amplification with Non-linear Components).

In the article "Linear Modulators Based on RF Synthesis: Realization and Analysis", IEEE Transactions on Circuits and Systems—I: Fundamental Theory and Applications, Vol. 42, No. 6, July 1995, K.-Y. Chan, et al, analyse different methods of creating QPSK-modulated radio signals by radio frequency synthesis (QPSK=Quadrature Phase Shift Keying). All methods involved utilise the so-called CALLUM principle, which is a further development of the LINC principle (CALLUM=Combined Analogue Locked Loop Universal Modulator).

V. F. Dias, et al, render in their article "Sigma-Delta Modulators for High-Resolution and Wide-Band A/D Converter Applications", Microelectronics Journal, 25(1994, pp. 253–277, an account of broadband applications for single-bit, multi-bit and cascade coupled sigma-delta modulators.

It is known from Patent Specification U.S. Pat. No. 5,401,953 to utilise sigma-delta modulators in single and exponential radio frequency modulation, i.e. radio frequency modulation of quadrature-divided signal components. European Patent EP-B1 426 560 also discloses a solution in which sigma-delta modulators are used to modulate an input signal exponentially.

In the article "Complex-Signal Sigma-Delta Modulators for Quadrature Bandpass A/D Conversion", Microelectronics Journal, Vol. 27, No. 6, 1996, pp. 505–524, V. da Fonte Dias gives an account of the advantageous noise filtering that can be achieved with the use of complex sigma-delta modulators. These modulators make possible noise transmission functions that are not symmetrical with respect to d.c. voltages. As a result, the design methodology can be made very simple with respect to lower and higher order cascade topologies for this type of modulator.

The article "Progress in UWB Generation with Linear Silicon Switches", Optically Activated Switching III, SPIE, Vol. 1873, 1993, pp. 238–248, by K. Cardwell, et al, disclose methods of generating ultra bandwidth radar pulses with the aid of light-activated silicon switches, LASS (LASS=Light Activated Silicon Switch).

Two different methods of providing very high frequency electromagnetic pulses with the use of a pulse laser, optical delay device and a photoconductive switch are disclosed in the article "High Speed, High Resolution Analogue-to-Digital Conversion using a Hybrid Electro-Optic Approach", 1995 IEEE International Symposium on Circuits and Systems, pp. 704–707, by R. Mason, et al, and in U.S. patent specification U.S. Pat. No. 5,401,953.

Highly reliable, long lifetime silicon photoconductive switches are known from the article "Long Lifetime Silicon Photoconductive Semiconductor Switches", Optically Activated Switching III, SPIE, Vol. 1873, 1993, pp. 27–38, by A. Rosen.

The production of plasma for fusion reactors, the detection of X-ray radiation and the generation of broadband high power pulses in pulse radar applications are examples of further fields in which optically activated switches are used.

SUMMARY OF THE INVENTION

The present invention presents arrangements and methods for pulse-shaping and power amplification of a general information signal, which may be analogue or digital, simple or quadrature-divided into two signal components. The solution proposed provides high linearity and also high efficiency over a wide frequency band.

Solutions for D/A-conversion and A/D-conversion can be obtained with sigma-delta modulation over a large dynamic range, because the oversampling and noise filtration used therewith reduces both the requirement of linearity of the analogue circuits included and the matching requirement therebetween. Furthermore, the anti-aliasing filter used in the solutions can be made relatively simple, wherewith the solutions are well-suited for integrated circuits. Unfortunately, there are at present no circuits that are fast enough to synthesise a radio frequency signal directly in accordance with this method.

The solution taught by U.S. Pat. No. 5,401,953 uses a lowpass single-bit sigma-delta modulator in combination with a conventional power amplifier for generating a radio frequency information signal.

The solution described in the article "High Speed, High Resolution Analogue-to-Digital Conversion using a Hybrid Electro-Optic Approach", 1995 IEEE International Symposium on Circuits and Systems, pp. 704–707 by R. Mason, et al, includes a method of generating very high frequency electromagnetic pulses with the aid of a pulse laser, optical delay devices and photoconductive switches.

However, no solution has earlier been described in which a signal-delta modulated information signal is pulse shaped and power amplified with the aid of voltage supplied switches that, in turn, are controlled by the pulse-shaped information signal.

Accordingly, an object of the present invention is to achieve highly effective, linear pulse shaping and power amplification of a digital input signal with the aid of a switch unit that includes conductive elements that are sensitive, or responsive, to ionising radiation.

A digital signal which can be readily pulse shaped and which is insensitive to non-linearities in the power amplifier is obtained beneficially by sigma-delta modulation. A sigma-delta modulator can generate numerous signal values from arbitrary analogue or digital information signals.

A first arrangement proposed in accordance with the invention sigma-delta modulates an incoming information signal and generates a digital signal that can assume M-number of different discrete signal values. The digital signal is then converted in a mixing and amplifying unit to a voltage switched information-carrying signal from which a desired part of the spectrum of the signal is extracted by filtration. A voltage switched signal is obtained from the digital signal by controlling M switches in accordance with the information content of the digital signal. Each switch is connected to a switch-unique supply voltage and to an output that is common to all switches. When a given switch is closed, the supply voltage of said switch becomes available on the output. The switches are controlled so that only one switch is closed at a time. The voltage switched information-carrying signal is comprised of the voltage variations on the output common to said switches. The inventive arrangement is characterised by the features set forth in the following claim 1.

In a second arrangement proposed in accordance with the invention, two digital signals are generated from two quadrature-divided information -signal components, by separate sigma-delta modulation of respective signal components. The digital signals can take M-different discrete signal values. The digital signals are converted to voltage switched information-carrying signals in two mixing and amplifying units, whereafter the information-carrying signals are added in a downstream summating unit in which a summation signal is formed. The desired part of the spectrum is taken finally from summation signal by filtration. A voltage switched signal is produced from the digital signals in the same way as that described above, by controlling M-switches in accordance with the information content of respective digital signals. This arrangement has the characteristic features set forth in the following claim 2.

A third arrangement proposed in accordance with the invention generates two quadrature-divided digital signals from an incoming information signal with the aid of a sigma-delta modulator. The digital signals can take M-number of different discrete signal values. Voltage switched information-carrying signals corresponding to the digital signals are generated in two mixing and amplifying units, these information-carrying signals being summated in a downstream summation unit to form a summation signal. A desired part of the spectrum is separated from the summation signal by filtration. Voltage switched signals are produced from the digital signals, by using M switches in the same way as that described with regard to the first proposed arrangement. The arrangement is thus characterised by the features set forth in the following claim 3.

The invention also relates to a method for pulse-shaping and power amplification of an incoming information signal. According to the method, the information signal is restructured to a digital signal that includes M-discrete signal values, by sigma-delta modulation. The n-bit words, where $n=^2\log M$ for instance, representing the digital signal are multiplied by a given symbol sequence, which may be a so-called Hadamard sequence, for instance. A binary local oscillator signal 0, 1] is a simple example of a possible Hadamard sequence. However, any other symbol sequence that is repeated periodically will do equally as well. Those symbols included in the symbol sequence may also be m-near, i.e. each symbol may take one of m-different discrete values.

The signal resulting from the multiplication process is decoded and controlled, or steered, to a given switch of M possible switches in accordance with the value concerned. Each switch is connected to a switch-unique supply voltage and also to an output which is common to all switches. When a given switch is closed, its supply voltage becomes available on said output and the switches are controlled so that only one switch will be closed at a time. The voltage switched information-carrying signal is comprised of the voltage variations on the common output of said switches. A desired part of the spectrum is extracted from the information-carrying signal by bandpass filtration. This method is characterised by the features set forth in the following claim 12.

A second inventive method for pulse-shaping and power amplification of an incoming information signal comprises restructuring the information-carrying signal to a digital signal by sigma-delta modulation, wherein said digital signal may take M-different discrete signal values. The digital signal is decoded and controlled, in accordance with the value concerned, to a given pulse generator which delivers a pulse of specific length. The pulse is converted to ionising radiation and divided up into different components. Each component is sent through a separate delay element, all delay elements generating different signal delays. The pulses of ionising radiation are then combined to M pulse-trains such that the pulse trains together will represent a product signal of the digital signal and a given symbol sequence. Each pulse train of ionising radiation irradiates a given conductive element, the electrical conductivity of which depends on the amount of ionised radiation that impinges or falls on the element. When impinged upon by ionising radiation, each conductive element will deliver to an output that is common to all conductive elements a supply voltage which is unique to said element. The conductive elements are irradiated in a manner such that only one element will be conductive at any given moment in time. This method is characterised by the features set forth in the following claim 14.

A third inventive method for pulse-shaping and power-amplifying incoming information signals involves sigma-delta modulating two quadrature-divided information signal components into two M-near digital signals, i.e. signals that can each take M-different discrete signal values. The digital signals are mixed and amplified separately, although the same symbol sequence is used in the up-mixing process. However, the second digital signal is mixed with a symbol sequence that is displaced one-quarter period in relation to the symbol sequence that is used for up-mixing the first digital signal. A voltage switched signal is created with the aid of a switch unit that utilises ionising radiation and M-conductive elements in one of the aforedescribed ways. The up-mixed and voltage-switched signals are summated to provide a summation signal, whereafter the desired power signal is obtained by filtration of the summation signal. This method is characterised by the features set forth in the following claim 15.

In a fourth inventive method for pulse shaping and power-amplifying an incoming information signal, the information signal is divided into two quadrature components by sigma-delta demodulation, wherein the components are mixed, amplified, combined and filtered analogously with the last described method. This fourth method is characterised by the features set forth in the following claim 16.

The proposed arrangements and methods thus solve both the problems encountered with present-day MCPA solutions and those problems with which all hitherto known linear modulation systems are encumbered with regard to efficiency and linearity, without the first-mentioned being achieved at the cost of the last-mentioned or vice versa. The oversampling and noise filtration applied in the sigma-delta modulating process makes possible high linearity of the output signal while, at the same time, enabling non-linear power amplifiers based on switch technology to be used.

Pulse-shaping and power amplification of information signals with the aid of sigma-delta modulation and switch-based amplification avoids combining high power signals. This enables radio signals to be generated without using bulky power combiners. Furthermore, it is not necessary to match the phase or amplitude of ingoing signal components, wherewith circuit implementation for an incoming analogue information signal is relatively simple. The circuitry is further simplified by the fact that microwave construction can be avoided even when generating radio signals in the microwave range.

Pulse-shaping and power amplification with the aid of sigma-delta modulators in accordance with the invention obviates the need of trimming the ingoing components. In addition, the construction can be scaled to very high voltages and powers. The amplifier may include wide bandwidths, despite having a high power output. Because of the wide bandwidth of the amplifier, relatively low demands are also placed on transmitter filters. The optical switches of the switch unit also give perfect backward isolation and minimum jitter.

Solutions with which quadrature-divided information-signals are sigma-delta modulated, mixed and amplified separately, or wherewith the sigma-delta modulator generates quadrature-divided digital signals, are very easily implemented. However, it is necessary to accurately match phase and amplitude between the ingoing signal components, i.e. between the I-channel and Q-channel.

The invention also enables a compromise to be made between oversampling factor and circuit complexity, by combining multi-bit sigma-delta modulators with multi-level type power amplifiers.

The proposed method and arrangement also enable a plurality of CDMA channels to be superimposed on one and the same carrier wave, or of simultaneously amplifying several narrow band carrier waves within a given frequency band.

OFDM signals that have high peak factors PF, i.e. high quotients between maximum peak power $P_p$ and mean effect capped P may be amplified effectively in accordance with the proposed method since the method affords very high dynamics.

Finally, the proposed method provides small, inexpensive and simple circuit solutions for MCPA applications.

BRIEF DESCRIPTION OF THE DRAWINGS

FIG. 12 is a circuit diagram of the mixing and amplifying unit 11420 in FIG. 11;

FIGS. 13a–13d illustrate diagrammatically an example of how the signal amplitude for the three most important signals in FIG. 12 can vary with time;

The invention will now be described in more detail with reference to preferred exemplifying embodiments thereof and also with reference to the accompanying drawings.

DETAILED DESCRIPTION OF PREFERRED EMBODIMENTS

Figure 1:
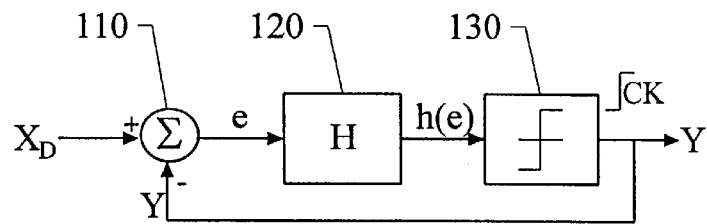
FIG. 1 is a block schematic of a known sigma-delta modulator for a digital input signal.

FIG. 1 is a block schematic that illustrates how an incoming digital signal $X_D$ is modulated typically in a sigma-delta modulator to form a digital output signal Y. It is assumed for the sake of simplicity that the digital output signal Y is binary, i.e. is able to take two different signal values, such as one 1 and minus one −1. However, the output signal Y may conveniently include several bits in practice and can therewith be said to assume more than two different signal values. A summator 110 forms a difference signal e between the incoming signal $X_D$ and the output signal Y. the difference signal e is filtered in a digital filter 120 with the transmission function H, therewith obtaining a filtered signal h(e). This signal h(e) is compared with a reference level in a clocked CK quantizer 130. If the filtered signal h(e) exceeds the reference level, the quantizer 130 delivers a first digital signal, for instance a one 1, whereas if the filtered signal h(e) is beneath the reference level, the quantisizer 130 delivers a second digital signal, e.g. a minus one −1. The reference level is, as a rule, set to the arithmetical mean value of the two nearest possible signal values of the output signal Y. Thus, M−1 reference levels are required when the output signal Y includes an alphabet of M possible signal values. The reference level is thus set to zero in the special case of when the output signal Y is binary and includes the symbols 1 and −1.

Figure 2:
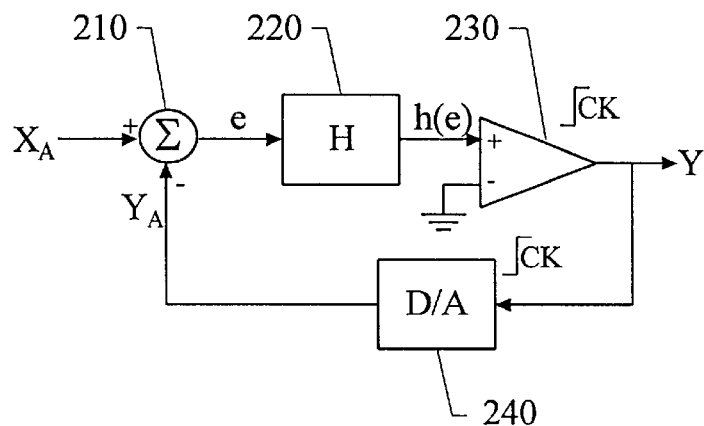
FIG. 2 is a block schematic of an earlier known sigma-delta modulator for an analogue input signal.

Correspondingly, FIG. 2 is a block schematic illustrating how an incoming analogue signal $X_A$ is modulated typically in a sigma-delta modulator and forms a digital output signal Y, which is also binary in this case. A difference signal e between the incoming signal $X_A$ and an analogue correspondence $Y_A$ to the digital output signal Y is determined by a summator 210. The difference signal e is filtered in an analogue filter having the transmission function H, wherewith a filtered signal h(e) is formed. The filtered signal h(e) is compared with the voltage level zero volt in a clock CK comparator 230. If the filtered signal h(e) exceeds the zero level, the comparator 230 delivers a first digital signal, e.g. a one 1, whereas if the filtered signal h(e) is beneath the zero level, the comparator 230 delivers a second digital signal, e.g. a minus one −1. However, the output signal Y will preferably include more than a single bit in the analogue case, since a given resolution therewith requires a lower sampling rate. The output signal Y is converted to a corresponding analogue signal $Y_A$ in a clocked CK D/A converter 240 and returned to the summator 210. In order to ensure synchronisation between the D/A converter 240 and the comparator 230, these two units 230, 240 are controlled by the same clock signal CK.

The transmission function $$\frac{Y}{X} = \frac{H}{1+H}$$

the sigma-delta modulator, where $X=X_D$ or $X_A$, has a lowpass character and hence the desired spectrum of the output signal Y is obtained by lowpass filtering the output signal. However, in the majority of radio applications the transmission function H of the digital filter 120 will prefer-ably be a bandpass-type function, since the quantisizing noise e=X−Y having the transmission function $$\frac{Y}{E} = \frac{1}{1+H}$$

can therewith be moved effectively outside the useful frequency spectrum of the output signal Y.

Figure 3:
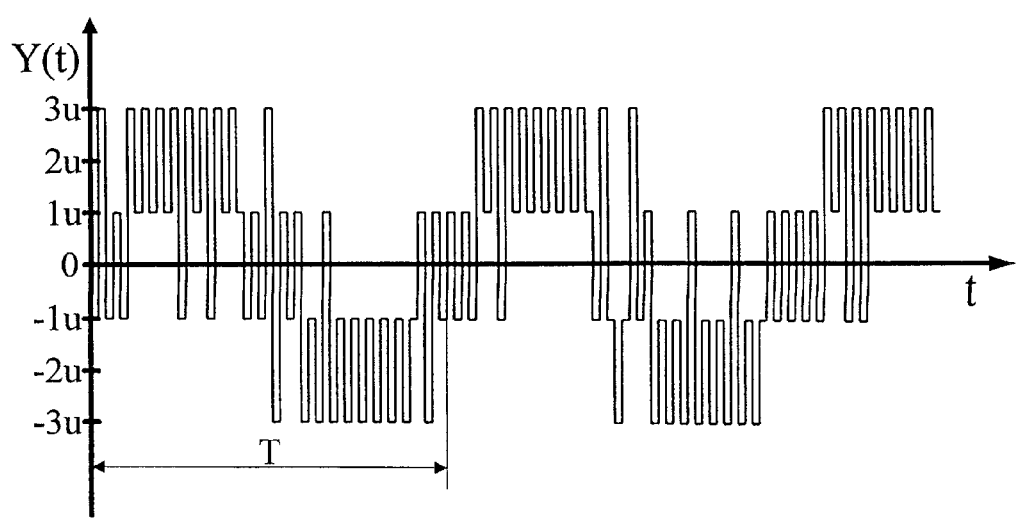
FIG. 3 illustrates an example of an output signal from a four-level sigma-delta modulator supplied with a sine signal.

FIG. 3 shows an example of an output signal from a sigma-delta modulator having four possible output signal values 3u, 1u, −1u and −3u which are supplied with an analogue sinus signal $X(t)=2u \cdot \sin(2\pi t/T)$, i.e. having amplitude 2u and period time T. In the illustrated example, the sampling frequency of the sigma-delta modulator has been chosen to be 48 times higher than the frequency of the sinus signal, meaning that the oversampling factor is equal to 24. Consequently, 48 samples of the output signal Y(t) are used to represent one period of the input signal X(t. Seen statistically, the output signal Y(t) will most often take the value 1u when the input signal X(t lies above a first reference level 0 but beneath a second reference level 2u, whereas when the input signal X(t exceeds the reference level 2u, the output signal Y(t) will often take the value 3u, and so on. The output signal Y(t) in question is dependent on both the input signal X(t and the value of the nearest preceding output signal Y(t−1). Seen generally, the output signal Y(t) will therefore alternate randomly between two adjacent signal values from sample to sample. When the input signal X(t) is roughly equal to zero, the output signal Y(t) will switch randomly between the values 1u and −1u. The output signal Y(t) will correspondingly vary randomly between 1 u and 3u when the input signal X(t) is approximately equal to 2u, and between −1u and −3u when the input signal X(t is about −2u. However, even greater random variations occur as will be evident from FIG. 3.

Figure 4:
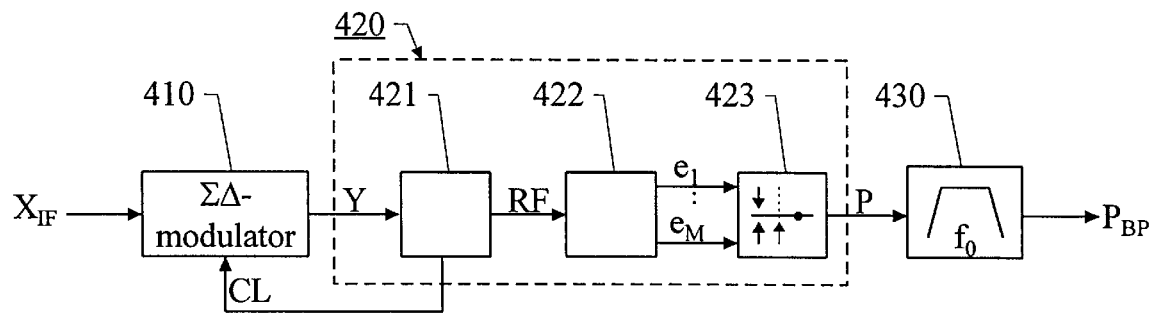
FIG. 4 is a block schematic illustrating an arrangement for pulse-shaping and power-amplifying a general information signal in accordance with a first embodiment of the proposed method.

FIG. 4 is a block schematic which illustrates a first embodiment of an inventive arrangement. The arrangement pulse shapes and power amplifies an incoming information signal $X_{IF}$, by first processing the information signal $X_{IF}$ in a sigma-delta modulator 410. The sigma-delta modulator 410 may be a so-called bandpass-type modulator, meaning that its component filters 120 and 220 respectively have a bandpass filtering character, or a so-called lowpass-type modulator, meaning that its component filters 120 and 220 respectively have a lowpass filtering character. The sigma-delta modulator 410 may either be digital, as described with reference to FIG. 1 above, or analogue as illustrated in FIG. 2, depending on whether the information signal $X_{IF}$ is digital or analogue. An M-near digital output signal Y, i.e. a signal that can take M-different discrete values, is delivered on the output of the sigma-delta modulator 410. The digital signal Y represents a version of the information signal $X_{IF}$ that is sampled $f_s$ times per second. The digital signal Y is received in a mixing and amplifying unit 420 which includes a mixing unit 421, a decoding unit 422 and a switch unit 423. The digital signal Y is up-mixed in the mixing unit 421 with the aid of a given symbol sequence B to form a radio frequency signal RF. The symbol timing $f_B$ of the symbol sequence B is chosen to be equal to a multiple n of the sampling frequency $f_s$, i.e. $f_B = nf_s$. As a result of this choice, repetitions of the spectrum of the radio frequency signal RF over the Nyquist frequency at aliasing distorsion are aliased precisely over corresponding signal spectra beneath the Nyquist frequency and do not therewith degenerate the useful signal.

The radio frequency signal RF is controlled to a given input of the switch unit 423 with the aid of the decoding unit 422. There is generated in the switch unit 423 a voltage switched information-carrying signal P which is filtered in a filtering unit 430. A desired frequency band is extracted from the voltage switched signal P in the unit 430. The filtering unit 430 will preferably comprise a bandpass filter whose centre frequency $f_0$ is delivered on the output of the bandpass filtering unit 423. When wishing to obtain a signal spectrum around a higher multiple, e.g. m where m>n, of the symbol rate $f_B$ of the symbol sequence B, there is instead chosen a centre frequency $f_0$ corresponding to this multiple, i.e. $f_0=mf_B$. When the voltage switched signal P contains only low frequencies, such as in the case of audio applications for instance, it may be applicable for the filtering unit 430 to have the form of a lowpass filter of suitable bandwidth instead.

Figure 5:
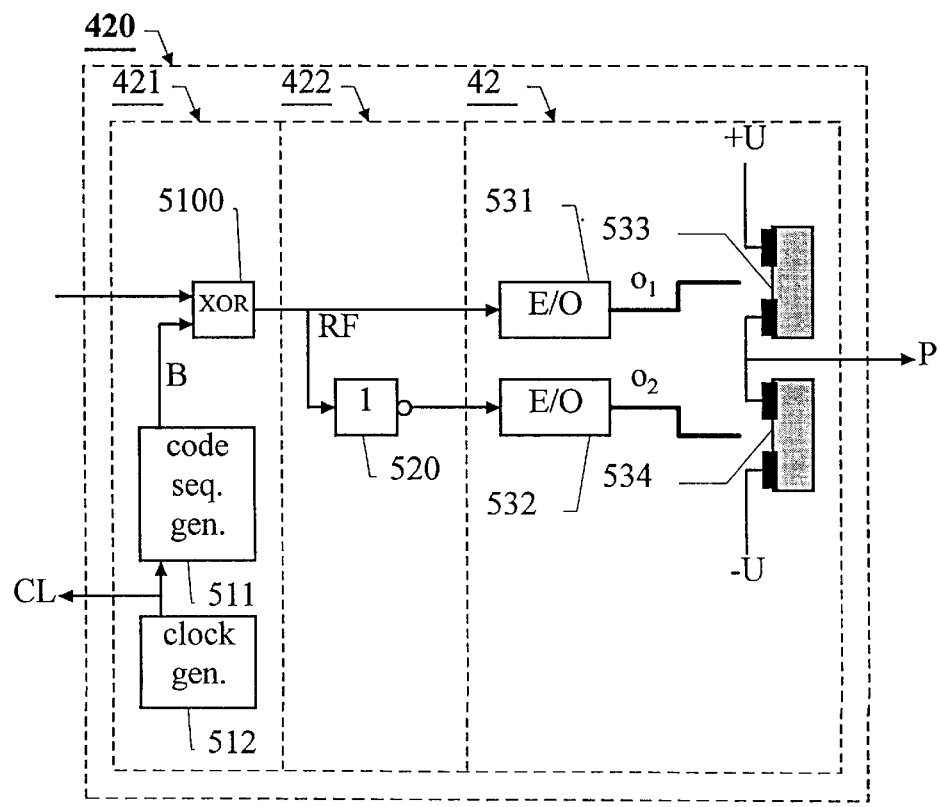
FIG. 5 is a circuit diagram illustrating a first variant of the mixing and amplifying unit 420 in FIG. 4.

FIG. 5 is a circuit diagram of a first variant of the mixing and amplifying unit 420 shown in FIG. 4. A binary digital input signal Y is received by a mixing unit 421, where the signal Y is multiplied by a bit sequence B in a multiplier 5100. This can be effected, for instance, by an EXCLUSIVE OR gate XOR. A radio frequency signal RF is formed in the multiplication process. The bit sequence B is generated in a code sequence generator 5110 and is, advantageously, a Hadamard sequence, for instance 1, 0] which is repeated in a continuous loop. The bit sequence B may, however, consist of any selected combination of m-near symbols that are repeated without interruption.

The mixing unit 421 also includes a clock pulse generator 5120 which generates a synchronising signal CL to the code sequence generator 5110 and the signal-delta modulator 410. The synchronising signal CL ensures that the sigma-delta modulator 410 and the code sequence generator 5110 operate synchronously.

The radio frequency signal RF is controlled in a decoding unit 422 to a first input of the switch unit 423 when the radio frequency signal RF has a first value, for instance 1, and to a second input when the radio frequency signal RF has a second value, for instance 0. In the binary case, decoding may be effected with the aid of an inverter 5200 which delivers the inverse of the radio frequency signal RF to the second input of the switch unit 423.

When the radio frequency signal RF has the signal value 1, there is activated in the switch unit 423 a first unit for generating ionising radiation 5310, whereas when the radio frequency signal RF has the signal value 0 the inverter 5200 delivers a signal that activates a second unit for generating ionising radiation 5320. In this variant of the mixing and amplifying unit 420, the ionising radiation comprises electromagnetic energy in the light wavelength region, and hence the units 5310 and 5320 respectively are laser units or other light-emitting units, such as light-emitting diodes, for instance. Each respective light-generating unit 5310 and 5320 generates a respective optical signal $o_1$ and $o_2$ when activated, this signal being transmitted to respective conducting elements 5330 and 5340 via an optical transmission medium. The primary transmission medium used in this regard are optical fibres, although air, prisms or glass rods are also suitable media for transmitting the respective optical signals $o_1$, $o_2$. The conductive elements 5330, 5340 consist of a material whose electrical conductivity depends on the amount of light impinging thereon, in other words the conductive elements are photoconductive switches. These switches may be transistors, thyristors or diodes. The active part of the photoconductive switches may conveniently comprise a substrate of gallium arsenide GaAs, gold doped silicon Au/Si $10^{-6}$ or copper doped silicon Cu/Si $10^{-6}$. The desired recombination time and therewith indirectly the on and off times of the photoconductive switches can be tailor-made by varying the impurity content of the substrates of the switches.

The first photoconductive switch 5330 is connected to a positive supply voltage +U and an output. The second photoconductive switch 5340 is connected to a negative supply voltage −U which will conveniently have the same absolute value as the positive supply voltage +U and the same output as the first photoconductive switch 5330. When the first photoconductive switch 5330 is irradiated with light $o_1$, its supply voltage +U will be available on said output, whereas when the second photoconductive switch 5340 is irradiated with light $o_2$ the supply voltage −U of the switch will be available on the output instead. The radio frequency radiation RF is decoded so that only one of the photoconductive switches will be closed at any one moment in time. The voltage switched information-carrying signal P can therefore be read as voltage variations on the common output of the photoconductive switches 5330, 5340.

The ionising radiation may also be electromagnetic radiation of X-ray length, or may consist of free electrons accelerated over a potential bridge. A gaseous medium, such as air for instance, may be used for X-ray transmission, whereas a vacuum is a more suitable transmission medium for electron rays. Conductive elements whose active parts consist of a material having a relatively large bandgap can be chosen in respect of electron rays and ionising radiation of X-ray wavelength. Diamond and silicon carbide SiC are examples of such material. A larger bandgap of the conductive elements results in a lower dark current, which in turn results in a lower noise level of the voltage-switched information-carrying signal P. However, the larger the bandgap of the conductive element, the more energy required per delivered photon. Naturally, conventional photoconductive elements may also be controlled by X-ray radiation and electronic rays. Conductive elements that utilise so-called photoquenching are also applicable for all types of ionising radiation. Photoquenching induces a higher recombination rate in the conductive element, which enables the switch to open more rapidly than in the case of traditional photoconductive switching.

Figure 6:
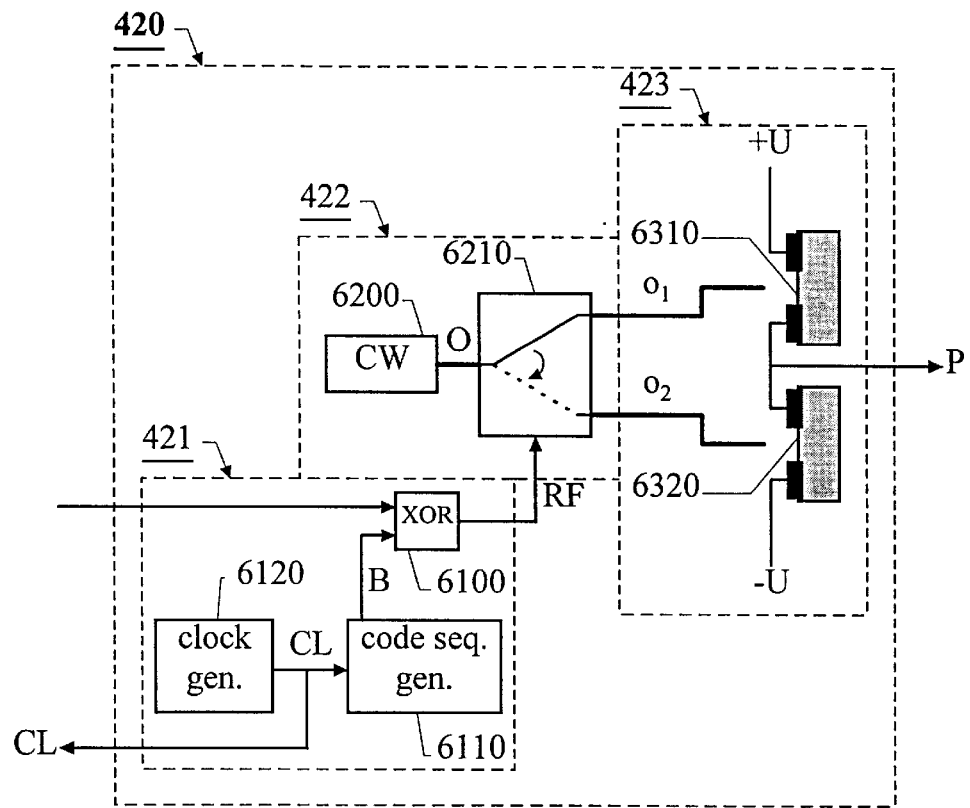
FIG. 6 is a circuit diagram illustrating a second variant of the mixing and amplifying unit 420 in FIG. 4.

FIG. 6 is a circuit diagram of a second variant of the mixing and amplifying unit 420 of FIG. 4. A binary digital signal Y is taken into a mixing unit 421 and there multiplied by a bit sequence B in a multiplier 6100. A radio frequency signal RF is generated in the multiplication process, in the same way as that described with reference to FIG. 5. The bit sequence B is produced in a code sequence generator 6110 which is clocked by a synchronising signal CL from a clock pulse generator 6120. The synchronising signal CL is also passed to the sigma-delta modulator 410 with the intention of ensuring coordination between the sigma-delta modulator 410 and the code sequence generator 6110.

The radio frequency signal RF is passed to an optical signal selector 6210 in a decoding unit 422. When the radio frequency signal RF assumes a first signal value, for instance 1, a constant optical signal O is sent from a light-generating unit 6200, e.g. a laser unit, to a first photoconductive switch 6310 in the switch unit 423 in the form of a first optical signal $o_1$, whereas when the radio frequency signal RF assumes a second signal value, for instance 0, the optical signal O is sent to a second photoconductive switch 6320 in the form of a second optical signal $o_2$. Since the rate at which the optical signal selector 6210 is able to control the optical signal O is, in principle, inversely proportional to the power of the optical signal O, it is desirable that the power of the optical signal O will be as low as possible. The optical power with which the photoconductive switches 6310, 6320 are illuminated shall be relatively high. Consequently, when pulse-shaping and switching at high data speeds, the switch unit 423 will also preferably include optical amplifiers that amplify the optical signals $o_1$, $o_2$ prior to said signals being passed to respective photoconductive switches 6310 and 6320.

Figure 7A:
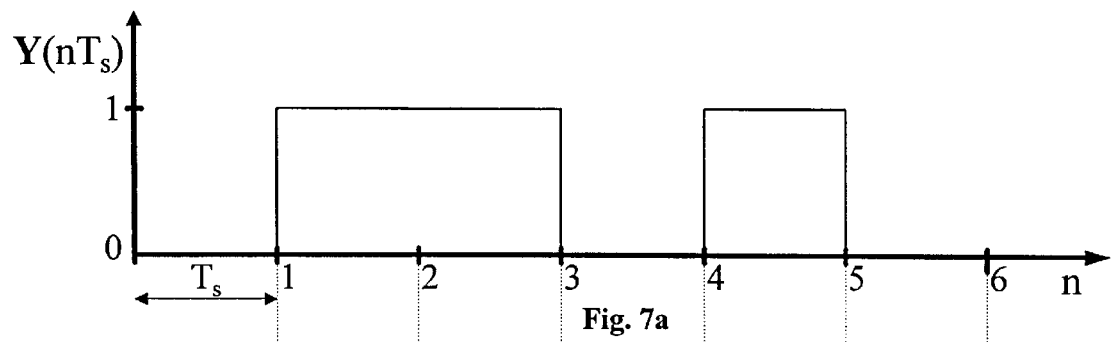
FIGS. 7a–7c illustrate diagrammatically an example of how the signal amplitude for the three most important signals in FIGS. 5 and 6 can vary with time.

FIG. 7a is a diagrammatical illustration of an example of how the signal amplitude $Y(nT_s)$ of the binary digital input signal Y in FIGS. 4–6 can vary with time t. The underlying information signal is assumed to be sampled $1/T_s$ times per second, meaning that the interval between two consecutive samples is $T_s$ seconds. Shown along the horizontal axis of the diagram is a parameter n that denotes sampling intervals instead of time t. The diagram represents the binary signal $Y(nT_s)$ as a function of $nT_s$. The signal $Y(nT_s)$ may assume the values 1 or 0 in the case of this example.

Figure 7B:
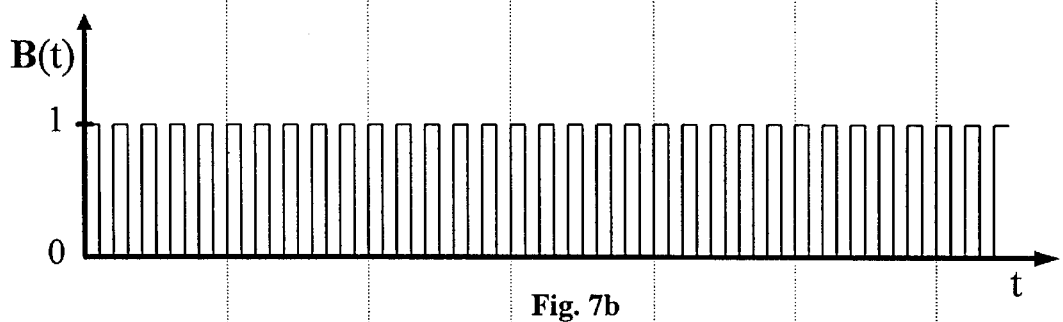

FIG. 7b illustrates the bit sequence B from the code sequence generator 5120 in FIG. 5 and 6120 in FIG. 6. this bit sequence B has a much higher bit rate than the digital signal Y. In this example, the bit rate of the bit sequence B has been chosen as $f_x \times 10$, which corresponds roughly to the lower limit of a reasonable value in practice. In this case, the bit sequence B assumes alternating values 0 and 1, which are represented along the vertical axis of the diagram. Time t is shown along the horizontal axis of the diagram.

Figure 7C:
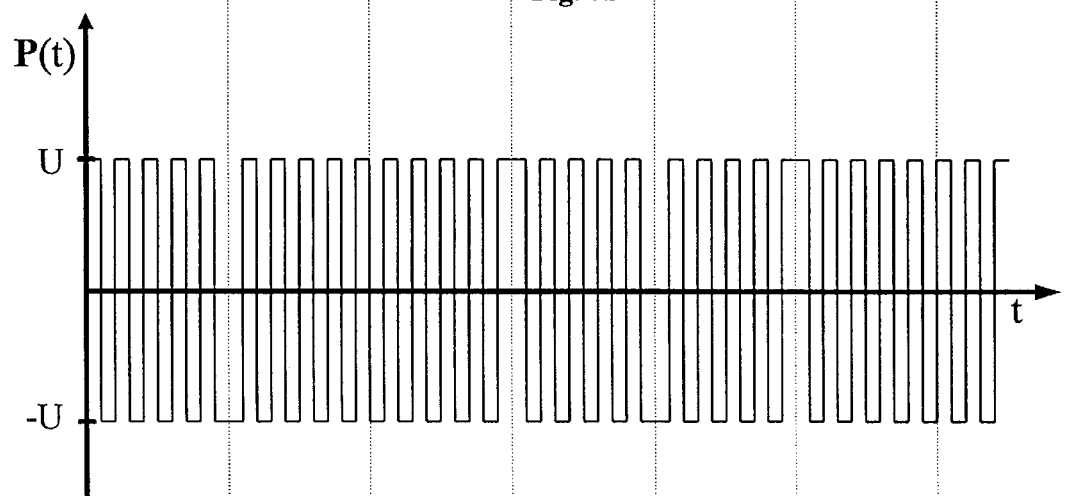

FIG. 7c illustrates the voltage switched information-carrying signal P in FIGS. 4–6. The diagram shows the signal P(t) as the function of time t. The amplitude of the voltage switched signal P(t) corresponds to the absolute value U of the supply voltages +U and –U respectively and its phase position is controlled by the value 1/0 of the digital signal Y. When the digital signal Y has the value 0, the voltage switched signal P(t) is identical with the bit sequence B, whereas when the digital signal Y has the value 1, the voltage switched signal P(t) is an inverted copy of the bit sequence B.

Figure 8:
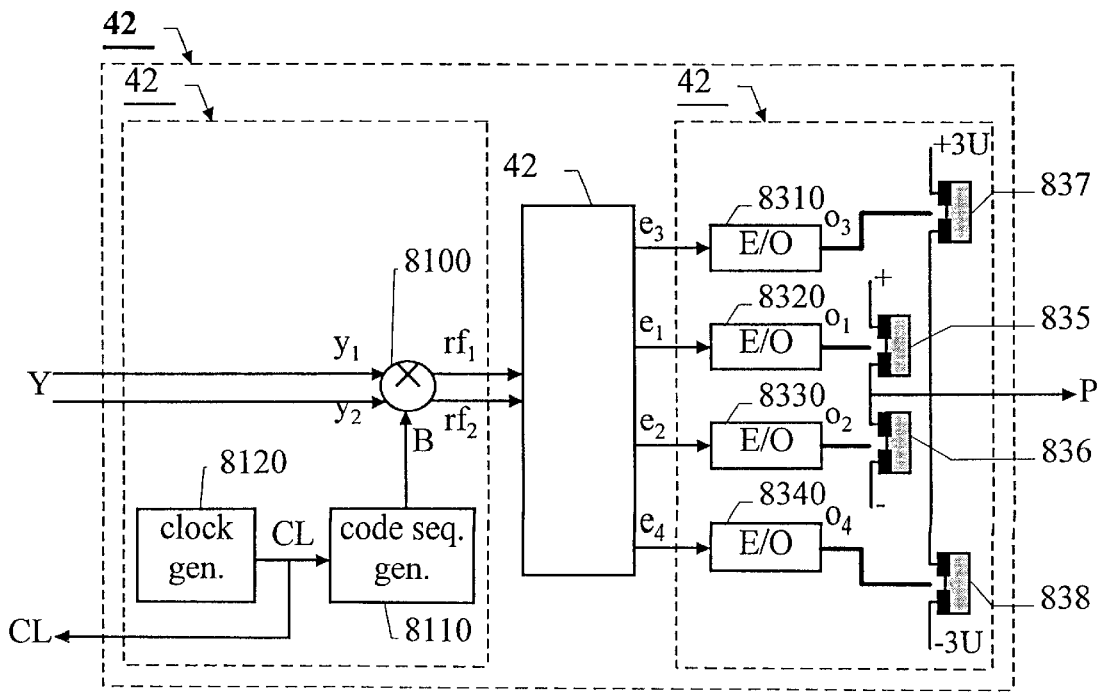
FIG. 8 is a circuit diagram illustrating a third variant of the mixing and amplifying unit 420 in FIG. 4.

FIG. 8 is a circuit diagram of a third variant of the mixing and amplifying unit 420 in FIG. 4, in which the digital input signal Y is quaternary, in other words is able to assume four different discrete signal values. The digital signal Y is received by a mixing unit 421 in which the signal is multiplied by a bit sequence B and generates a radio frequency information-carrying signal RF. Multiplication is effected with the aid of a multiplier 5100 whose one factor is comprised of a two-bit word $y_1$, $y_2$ from the digital signal Y and whose other factor is a bit from the bit sequence B. The product, in other words the information-carrying signal RF, is represented in the form of two binary bits $rf_1$, $rf_2$ that activate one of four outputs $e_1$–$e_4$ of a decoding unit 422. When the information-carrying signal RF assumes a first value, e.g. $rf_1 rf_2=00$, a signal is delivered on a first output $e_1$, whereas when the information-carrying signal RF assumes a second value, e.g. $rf_1 rf_2=01$, a signal is delivered on a second input $e_2$ and when the information-carrying signal RF assumes a third value, e.g. $rf_1 rf_2=10$, a signal is delivered on a third output $e_3$, and when the information-carrying signal RF assumes a fourth value, e.g. $rf_1 rf_2=11$, a signal is delivered on a fourth output $e_4$.

The signals on the output $e_1$–$e_4$ are converted to optical energy $o_1$–$o_4$ in light generating units 8310–8340 in a switch unit 423. Each optical signal $o_1$–$o_4$ irradiates a given photoconductive switch 8310–8340 whose conductivity depends on the amount of light that meets the switch.

All photoconductive switches 8350–8380 are connected to an output common to all said switches. The first switch 8350 is also connected to a first positive supply voltage +U; the second switch 8360 is connected to a first negative supply voltage –U; the third switch 8370 is connected to a second positive supply voltage +3U that is higher than said first positive supply voltage +U, and the fourth switch 8380 is connected to a second negative supply voltage –3U which is higher than said first negative supply voltage –U. When the photoconductive switches 8350–8380 are met by light pulses $o_1$–$o_4$, the respective voltage sources +U, –U, +3U, –3U deliver power to the common output in time with the variations of the radio frequency signal $RF=rf_1 rf_2$. This results in the delivery on the output of the switch unit 423 of an information-carrying voltage-switched signal P having an information content corresponding to the information content of the digital input signal Y.

The mixing unit 421 also includes a clock pulse generator 8120 which generates a synchronising signal CL to a code sequence generator 8110 and the sigma-delta modulator 410. The synchronising signal CL ensures that the sigma-delta modulator 410 and the code sequence generator 8110 operate synchronously.

The optical signals $o_1$–$o_4$ may, of course, also be comprised of ionising radiation of the aforementioned kind, i.e. X-ray radiation or electron beams. The photoconductive switches 8350–8380 may, in these cases, be replaced with conductive elements whose bandgaps are greater than those of the photoconductive elements.

Figure 9A:
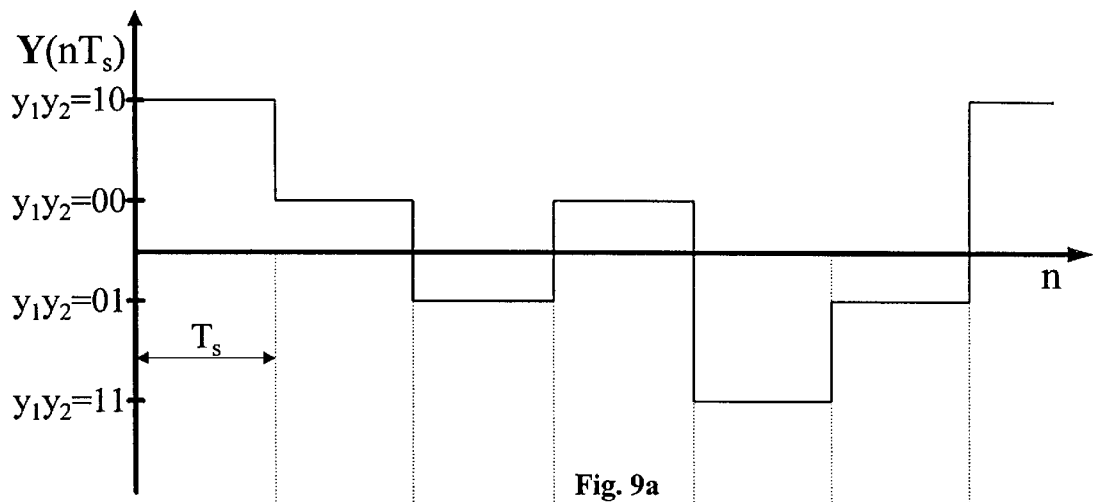
FIGS. 9a–9c illustrate diagrammatically an example of how the signal amplitude for the three most important signals in FIG. 8 can vary with time.

FIG. 9a is a diagrammatic illustration of an example of the signal amplitude $Y(nT_s)$ for the quaternary digital input signal Y in FIG. 8 as a function of the sampling interval n. The underlying information signal is assumed to be sampled $1/T_s$ times per second also in this case. The signal $Y(nT_s)$ can assume four different signal values: $y_1 y_2 = 00, 01, 10$ or $11$.

Figure 9B:
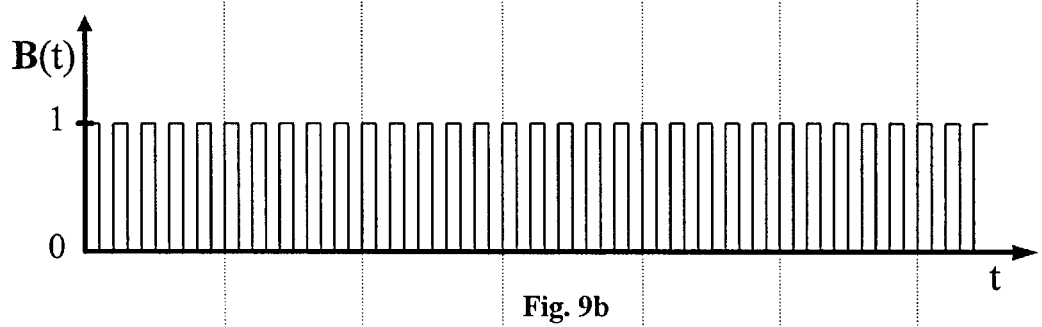

FIG. 9b illustrates the bit sequence B from the code sequence generator 8110 in FIG. 8. The bit rate of the bit sequence B is much higher than the bit rate of the digital input signal Y, and its amplitude alternates between the values 1 and 0. The diagram shows the amplitude B(t) along the vertical axis. The time t is shown along the horizontal axis.

Figure 9C:
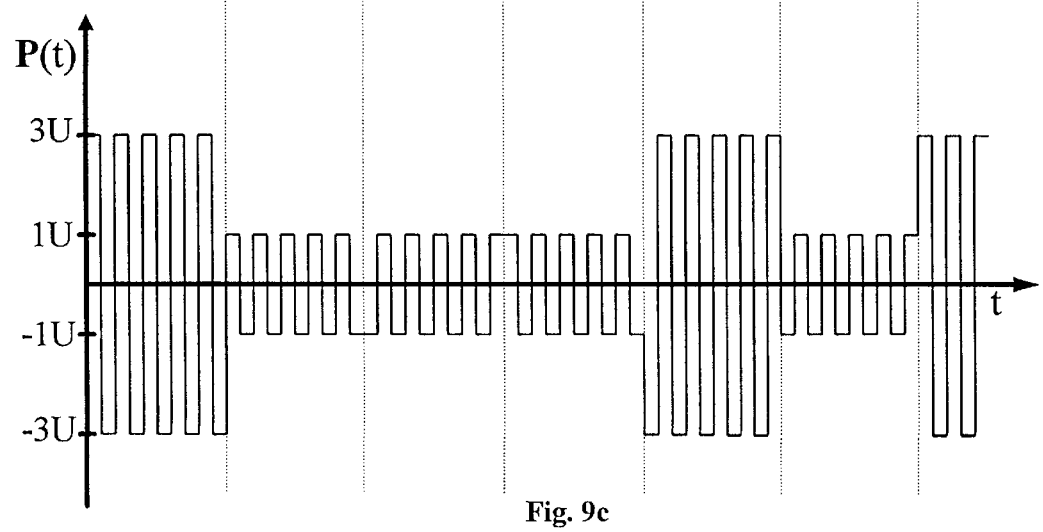

FIG. 9c illustrates diagrammatically how the voltage switched information-carrying signal P in FIG. 8 varies with time t. The amplitude of the voltage switched signal P(t) varies between the absolute values U and 3U of respective supply voltages +U, –U, 3U, –3U, and its phase position is controlled by the polarity of the digital signal Y. When the digital signal Y has positive polarity, i.e. has a value whose least significant bit is a zero 00 or 10, the phase position of the voltage switched signal P(t) coincides with the phase position of the bit sequence B(t), whereas when the digital signal $Y(nT_s)$ has negative polarity, i.e. a value whose least significant bit is a one 01 or 11, the voltage switched signal P(t) has an opposite phase position to the bit sequence B(t). When the digital signal $Y(nT_s)$ has the value 00 or 01, the voltage switched signal P(t) assumes a first amplitude U, whereas when the digital input signal $Y(nT_s)$ has the value 10 or 11, the voltage switched signal P(t) assumes a second amplitude 3U. The four positional alphabet 00, 01, 10, 11 of the digital signal $Y(nT_s)$ is thus represented in the voltage switched signal P(t) by a combination of two different amplitude levels U and 3U and two different phase positions 0° and 180°.

Figure 10:
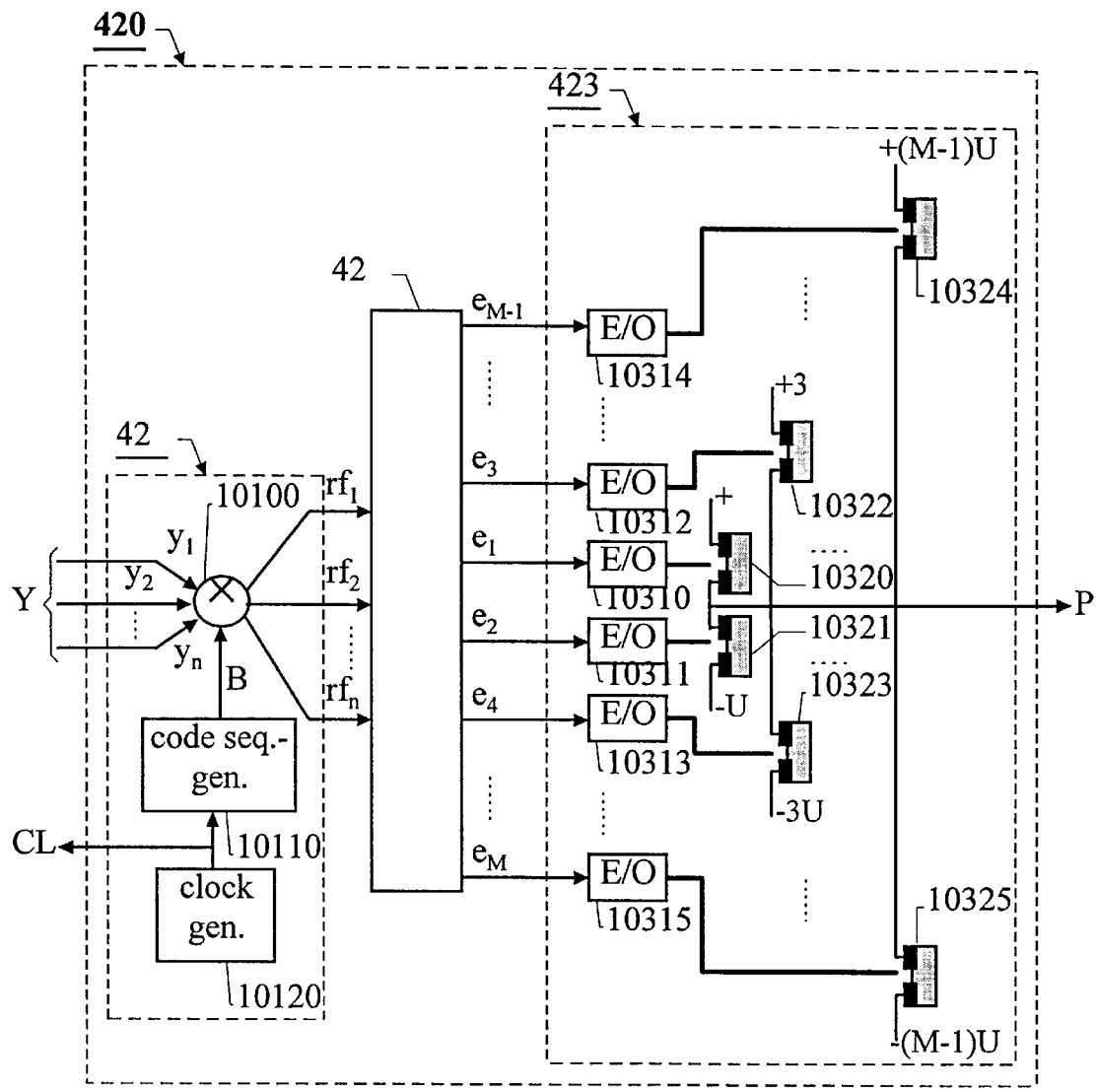
FIG. 10 is a circuit diagram of a fourth variant of the mixing and amplifying unit 420 in FIG. 4.

FIG. 10 is a circuit diagram of a fourth variant of the mixing and amplifying unit 420 in FIG. 4, where the digital input signal Y is assumed to be M-near, i.e. includes M-different discrete signal values. The signal Y is received in a mixing unit 421, in which it is multiplied by a bit sequence B and generates a radio frequency information-carrying signal $RF=rf_1, rf_2, \ldots, rf_n$. Multiplication is effected with the aid of a multiplier 10100 whose one factor is comprised of an n-bit word $y_1, y_2, , yn$; where $n = {}^2 \log M$ from the digital signal Y, and whose other factor is a bit from the bit sequence B. The product, in other words the information-carrying signal RF is represented in the form of n binary bits $rf_1$, $rf_2$, . . . , $rf_n$, which activate one of M outputs $e_1-e_M$ of a decoding unit 422. When the information-carrying signal RF assumes a first value, for instance $rf_1$. . .$rf_2$=0 . . . 0, a signal is delivered on a first output $e_1$, whereas when the information-carrying signal RF assumes an n:th value, for instance $rf_1$. . . $rf_2$=1 . . . 1, a signal is delivered on an M:th output $e_M$. All other M-2 outputs of the decoding unit 422 can be activated by intermediate M-2 combinations of the n bits in the information-carrying signal RF.

The signals on the outputs $e_1-e_M$ are converted to optical energy in light-generating units 10310–10315 in a switch unit 423. Each optical signal irradiates a given photoconductive switch 10320–10325, the conductivity of which depends on the amount of light that falls on the switch and the physical dimensions of said switch. All photoconductive switches 10320–10325 are connected to an output common to all switches. Furthermore, each switch is connected to a switch unique supply voltage. Thus, the first switch 10320 is connected to a first positive supply voltage +U, the second switch 8360 is connected to a first negative supply voltage −U, and so on up to the M-1 switch 10324 which is connected to an M/2 positive supply voltage +(M-1)U and the M:th switch 10325 which is connected to an M/2 negative supply voltage −(M-1)U. When light pulses impinge on the photoconductive switches 10320–10325, the voltage sources +U, −U, +3U, . . . , +(M-1)U, −(M-1)U deliver power to the common output in time with the variations of the radio frequency signal RF=$rf_1rf_2$ . . . $rf_n$. This results in the delivery of an information-carrying voltage switched signal P whose information content corresponds to the information content of the digital input signal Y on the output of the switch unit 423.

The alphabet of M-different signal values of the digital input signal Y is thus represented in the voltage switch signal P(t) by a combination of M/2 different amplitude levels U, 3U, 5U,..., M-1)U and two different phase positions 0° and 180°. The amplitude levels may, for instance, relate to each other as the numbers in the series (2i-1)U; where i=1, 2, . . ., M/2. Other distributions of the amplitude levels are also possible, however, using knowledge of the statistic behaviour of the input signal, for instance.

The mixing unit 421 of the illustrated embodiment also includes a clock pulse generator 10120 which generates a synchronising signal CL to a code sequence generator 10110 and the sigma-delta modulator 410. The synchronising signal CL ensures that the sigma-delta modulator 410 and the code sequence generator 10110 operate synchronously.

The optical signals may, of course, be replaced with ionising radiation of the kinds earlier discussed, i.e. X-rays and electron rays. In these instances, the photoconductive switches 10320-10325 can be replaced with conductive elements whose bandgaps are greater than the bandgaps of the photoconductive elements.

Figure 11:
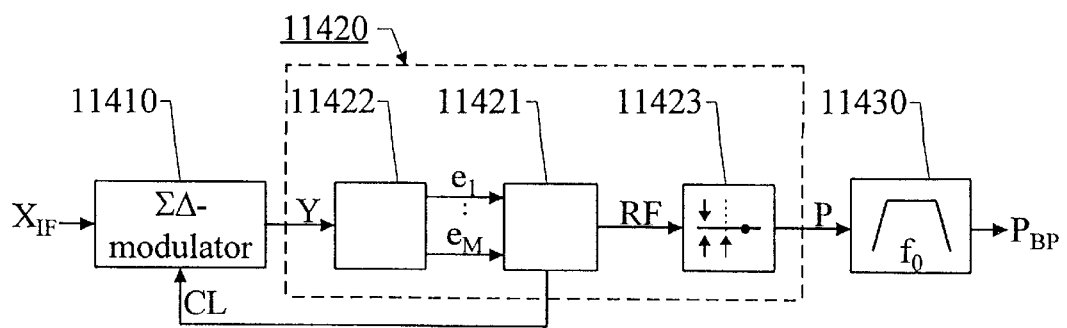
FIG. 11 is a block schematic illustrating an arrangement for pulse-shaping and power-amplifying a general information signal in accordance with a second embodiment of the proposed method.

FIG. 11 is a block schematic illustrating an arrangement according to a second embodiment of the invention. The arrangement radio frequency modulates and power amplifies an incoming information signal $X_{IF}$ by first processing the information signal $X_{IF}$ in a sigma-delta modulator 11410. The sigma-delta modulator 11410 may be a so-called bandpass type or lowpass type. The sigma-delta modulator 11410 may either be digital, as described with reference to FIG. 1, or analogue, as illustrated in FIG. 2, depending on whether the information signal $X_{IF}$ is digital or analogue. An M-near digital output signal Y is delivered on the output of the sigma-delta modulator. The digital signal Y represents a version of the information signal $X_{IF}$ that is sampled $f_s$ times per second. A mixing and amplifying unit 11420 which includes a decoding unit 11422, a mixing unit 11421 and a switch unit 11423 receives the digital signal Y.

The decoding unit 11422 controls the digital signal Y to one of M mixing devices in the mixing unit 11421, depending on the value in question of the digital signal Y.

The digital signal Y is up-mixed in the mixing unit 11421 to a radio frequency information-carrying signal RF, by signal division, delay and combination. The delay and combination gives a result corresponding to the result obtained in the first embodiment of the invention when multiplying the digital signal Y by a given bit sequence B.

The radio frequency signal RF is amplified with the aid of a switch unit 11423 to a voltage switched information-carrying signal P which is filtered in a filtering unit 11430. A band-limited power signal $P_{BP}$ is extracted from the information-carrying signal P in said unit 11430.

FIG. 12 illustrates an example of circuitry for the mixing and amplifying unit 11420 in FIG. 11 in the case of a binary digital signal Y, i.e. a signal that can assume two different discrete signal values. A decoding unit 11422 controls the digital signal Y to a first pulse emitter 12110 in a mixing unit 11421 when the digital signal Y has a first value, for instance 1, and to a second pulse emitter 12120 when the digital signal Y has a second value, for instance 0. In this binary case, decoding can be effected with the aid of an inverter 12200 which delivers the inversion of the digital signal Y to the second pulse emitter 12120 of the mixing unit 11421.

When the pulse emitters 12110, 12120 in the mixing unit 11421 receive the input signal 1, they generate a positive pulse of given length. The pulse emitters are then inactive until again receiving the input signal 1. In order for a pulse to be emitted, the time between two incoming Is ones must exceed the symbol time $T_s$ of the digital signal Y. Each pulse emitter 12110, 12120 delivers an output signal to a separate light generating unit 12130 and 12140 respectively, which converts the pulse into an optical pulse $o_1$, $o_2$ of equal length. The optical pulses $o_1$, $o_2$ are divided into a plurality of components in splitters 12150, 12160, and said components transmitted to combination units 12180, 12190 through the medium of optical transmission media, such as optical fibres 12170–12177 for instance, where the components are restored to a combined optical signal $c_1$ and $c_2$ respectively. In one given array of said optical fibres 12170, 12173, all fibres have mutually different lengths and therewith delay an optical pulse to different extents. When an optical pulse is transmitted into an array of optical fibres 12170–12173 simultaneously, the pulse exits from a first fibre 12170 at a first time point, from a second fibre 12171 at a second time point and at a slightly later time, from a third fibre 12172 at a third and still later time point, and from a fourth fibre 12173 at a fourth and still later time point.

FIG. 13*a* illustrates an example of a binary digital input signal Y($nT_s$) to the decoding unit 11422 in FIG. 12. When a first binary symbol 1, which is represented by a positive signal in this example, having a specific symbol time $T_s$ is received, the first pulse emitter 12110 generates a pulse. Illustrated in FIG. 13*b* is a first optical pulse $o_1$ of specific length $t_o$ that has been generated in the first laser unit 12130 from the pulse deriving from the pulse emitter 12110. The optical pulse o1 is divided in the first splitter 12150 into four identical pulses which are transmitted via four optical fibres 12170–12173 of mutually different lengths. A first component of the pulse arrives at the first combination unit 12180 from the first fibre 12170 at a first time point. This component forms a first part of a third combined optical signal $c_1$ which irradiates a first photoconductive switch 12310 in a switch unit 11423. When the light pulse meets the switch 12310, the switch is closed and a third supply voltage +U becomes available on the output of said switch unit. This voltage +U forms a first part of the voltage switched information-carrying signal P(t) shown in FIG. 13*d*.

When the first component of the optical pulse O1 is finished, a second component of the optical pulse arrives at the second combination unit 12190 via the second optical fibre 12171. This second component forms a first part of a second combined optical signal $c_2$ which irradiates a second photoconductive switch 12320 in the switch unit 11423. When the switch 12320 is met by the light pulse, the switch 12320 is closed and a second supply voltage −U becomes available on the output of the switch unit 11423. This voltage −U forms a second part of the voltage switched information-carrying signal P(t).

The remainder of the voltage switched information-carrying signal P(t) is built-up in a corresponding manner with the aid of the third 12172 and the fourth 12173 optical fibre during the remaining period of the symbol time $T_s$ for the second binary symbol 0 in the digital signal $Y(nT_s)$.

The second pulse emitter 12120 generates a pulse, where a second binary symbol 0, which in this example is represented by the zero level, having the same symbol time $T_x$ as the first symbol 1 is received. This pulse is converted in the second laser unit 12140 to a second optical pulse $l_2$ whose length $t_o$ is identical to the length of the first optical pulse $o_1$ and which is shown in FIG. 13*c*. The optical pulse $o_2$ is divided into four identical pulses in the second splitter 12160, these identical pulses being transmitted via four optical fibres 12174–12177 of mutually different lengths. A first pulse component arrives at the second combination unit 12190 via the first fibre 12174 at a first time point.

This first component forms a part of the second combined optical signal $c_2$ which irradiates the second photoconductive switch 12320. When the switch 12320 is met by the light pulse, the switch 12310 is closed and the second supply voltage −U becomes available on the output of the switch unit 11423. At the end of the first component of the optical pulse $o_2$, a second component of the optical pulse arrives at the first combination unit 12180 via the second optical fibre 12175. This second component forms a part of the first combined optical signal $c_1$ which illuminates the first photoconductive switch 12310. When the switch 12310 is met by the light pulse, the switch 12310 is again closed and the first supply voltage +U becomes available on the output of the switch unit 11423. The remainder of the voltage switched information-carrying signal P(t) is built-up in a corresponding manner with the aid of the third 12176 and the fourth 12177 optical fibre during the remaining part of the symbol time $T_s$ for the second binary symbol 0.

Thus, the second binary symbol 0 in the alphabet of the digital signal Y is represented in the voltage switched information-carrier signal P(t) as a phase inverted copy of the representation of the first binary symbol 1 in the alphabet of said digital signal Y.

As an alternative delaying element to optical fibres, the optical signals $o_1$, $o_2$ may be caused to pass through any other suitable transmission medium through paths of mutually different lengths, for instance through one or more prisms.

In this embodiment of the invention, the number of light-generating units, splitters, combining units and mutually independent switches is identical to the number of possible signal values of the digital signal Y. Thus, when the digital signal alphabet includes M-different symbols, M number of light-generating units, M-number of splitters, M-number of combining units and M-number of mutually independent switches are required. More than M switches, for instance 2M switches can be used, when the switched voltages is so high and/or the switching rate is so high as to necessitate alternating use of the switches in order to have time to cool the switches sufficiently. In this variant of the invention, a pair of switches is controlled in parallel, although only one of the switches is voltage-connecting. The number of independent switches is thus still M.

The number of light-generating units can be reduced to one, by using one optical signal selector. This light-generating unit is then controlled in a manner analogous with the manner described with reference to FIG. 6, in accordance with the value of the digital signal Y to M-different splitters.

The optical signals may, of course, also be replaced by ionising radiation of the kind earlier discussed even in this application of the invention. The ionising radiation may, for instance, consist of X-rays or electron rays. The photoconductive switches 12310, 12320 can then be replaced with conductive elements that are responsive primarily to electromagnetic energy in the X-ray wavelength range and to free electrons respectively, the light-generating units replaced with X-ray tubes and electron guns respectively, and the delay elements replaced with elements that include a transmission medium adapted for respective types of radiation.

Figure 14:
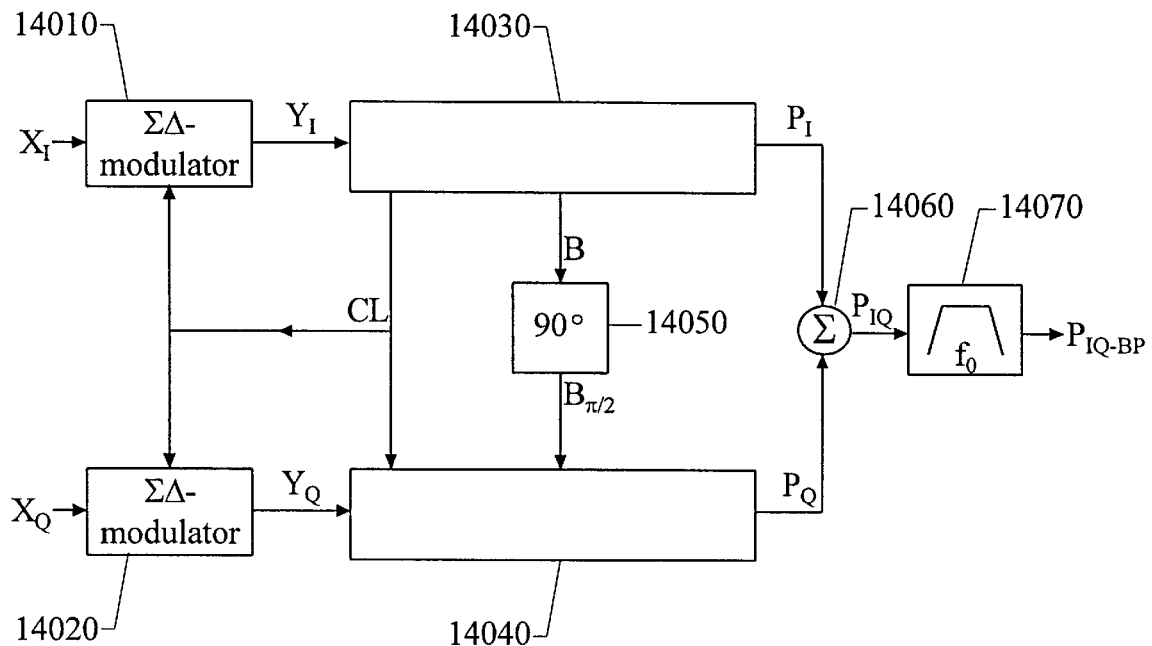
FIG. 14 is a block schematic illustrating an arrangement for pulse-shaping and power-amplifying a general information signal that has been divided into quadrature signal components in accordance with a third embodiment of the proposed method.

FIG. 14 is a block schematic illustrating a third embodiment of an inventive pulse-shaping and power-amplifying arrangement. A first signal $X_1$, which represents a first quadrature-divided information signal component, for instance in an I-channel, of an underlying information signal is received by a first sigma-delta modulator 14010, and a second signal $X_Q$ which represents a second quadrature-divided information signal component, for instance a Q-channel, of the same underlying information signal is received by a second sigma-delta modulator 14020. The first sigma-delta modulator 14010 modulates the first incoming signal $X_1$, wherewith a first digital signal $Y_1$ is obtained, and the second sigma-delta modulator 14020 modulates the second incoming signal $X_Q$, wherein a second digital signal $Y_Q$ is obtained. The digital signal $Y_1$, $Y_Q$ are delivered interleaved, in other words the second $Y_Q$ digital signal is set to zero when the first digital signal $Y_1$ has a signal value, and vice versa. The respective sigma-delta modulators 14010 and 14020 may be digital, as described with reference to FIG. 1, or analogue, as described with reference to FIG. 2, depending on whether the input signals $X_1$, $X_Q$ are digital or analogue. The sigma-delta modulators 14010 and 14020 may be of the lowpass-type or bandpass-type, depending on which is best suited for the application in question.

The digital signals $Y_1$, $Y_Q$ are processed in respective mixing and amplifying units 14030 and 14040 in accordance with the first or second embodiment of the invention described with reference to FIG. 4 and FIG. 11 respectively. However, the second mixing and amplifying unit 14040 does not use its own symbol sequence for up-mixing the digital signal Y, but instead uses a symbol sequence B taken from the first mixing and amplifying unit 14030 and phase-shifted 90° $B_{\pi/2}$ in a phase-shifting unit 14040. In addition, a synchronising signal CL is transmitted from the first mixing and amplifying unit 14030 to the second mixing and amplifying unit 14040 and to the sigma-delta modulators 14010, 14020, to ensure that the system operates synchronously.

The first mixing and reinforcing unit 14030 delivers a first voltage-switched signal $P_I$ and the second mixing and amplifying unit 14040 delivers a second voltage switched signal $P_Q$ to a summation unit 14060 in which the voltage switched signals $P_I$ and $P_Q$ are added and form a summation signal $P_{IQ}$.

The summation signal $P_{IQ}$ is filtered in a filtering unit 14070, wherewith a desired signal spectrum is extracted and a band limited signal $P_{IQ-BP}$ is generated. The centre frequency $f_0$ of the bandpass filter 14070 is preferably equal to half the symbol rate $f_{B/2}$ of the symbol sequence B, so that a signal spectrum around this centre frequency $f_o$ is delivered to the output of the bandpass filtering unit 14070. When wishing to obtain a signal spectrum around a higher multiple, for instance m where m>n, of the symbol rate $f_B$ of the symbol sequence B, there is instead chosen a centre frequency $f_0$ corresponding to this multiple, i.e. $f_0 = mf_B$.

Figure 15:
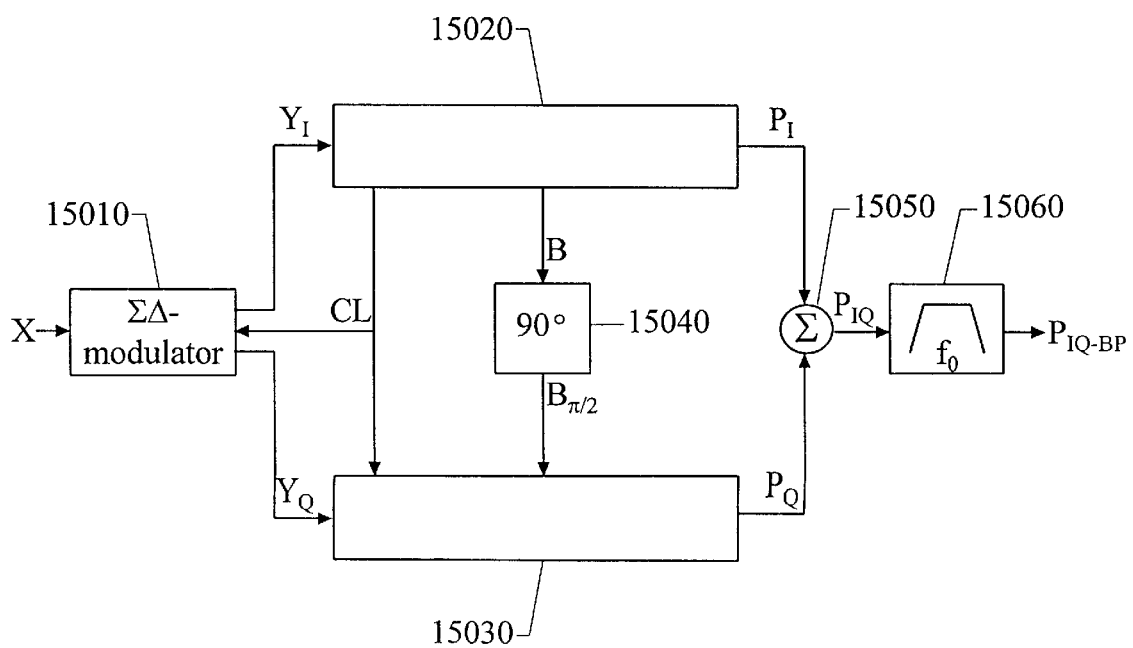
FIG. 15 is a block schematic illustrating an arrangement for dividing a general information signal into quadrature signal components that are pulse-shaped and power amplified in accordance with a fourth embodiment of the proposed method.

FIG. 15 is a block schematic illustrating a fourth embodiment of an inventive arrangement for pulse-shaping and power-amplifying an incoming information signal X. A sigma-delta modulator 15010 modulates the information signal X to provide a first $Y_1$ and a second $Y_Q$ quadrature-divided digital signal component. The digital signals $Y_I$, $Y_Q$ are delivered interleaved, i.e. the second signal component $Y_Q$ is set to zero when the first signal $Y_I$ has a signal value, and vice versa. The sigma-delta modulator 15010 may be digital or analogue, depending on whether the information signal X is digital or analogue, and the sigma-delta modulator 15010 may be of a lowpass-type or a bandpass-type.

The digital signals $Y_I$, $Y_Q$ are processed in the mixing and amplifying units 15020 and 15030 respectively in accordance with the first or the second embodiment of the invention described respectively with reference to FIG. 4 and FIG. 11. However, the second mixing and amplifying unit 15030 does not use its own symbol sequence but instead uses a symbol sequence B that has been taken from the first mixing and amplifying unit 15020 and phase-shifted through 90° $B_{\pi/2}$ in a phase-shifting unit 15040. The synchronising signal CL is also transmitted from the first mixing and amplifying unit 15020 to the second mixing and amplifying unit 15030 and to the sigma-delta modulator 15010 in order to ensure that the system operates synchronously.

The first mixing and amplifying unit 15020 delivers a first voltage switched signal $P_I$, and the second mixing and amplifying unit 15030 delivers a second voltage switched signal to a summation unit 15050 in which the voltage switched signals $P_Q$ are added to form a summation signal 15050. The summation signal $P_{IQ}$ is then filtered in a filtering unit 15060, wherewith a desired signal spectrum is extracted and a band limited signal $P_{IQ-BP}$ is generated in the same way as that described with reference to FIG. 14 above.

It can be mentioned that the switch units in the mixing and amplifying units 15020, 15030 need not be duplicated, since the digital signals $Y_I$, $Y_Q$ are interleaved and are therefore defined in alternating moments in time. The switch units 15020 and 15030 will thus operate alternately. Consequently, one and the same switch unit can be used to generate alternately voltage pulses that represent the first $P_I$ and the second $P_Q$ voltage switched signal respectively. Naturally, the same applies to the solution described above with reference to FIG. 14.

Figure 16:
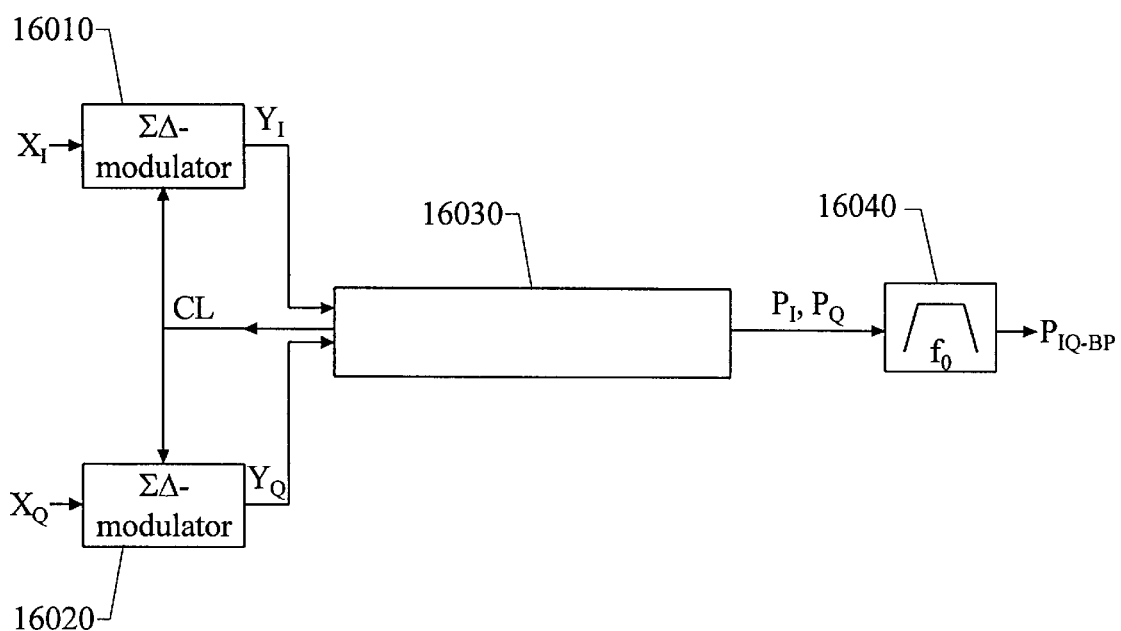
FIG. 16 is a block schematic illustrating an arrangement for pulse-shaping and power-amplifying a general information signal that has been divided into quadrature signal components in accordance with a fifth embodiment of the proposed method.

FIG. 16 is a fifth embodiment of an inventive pulse-shaping and power-amplifying arrangement. This solution presumes that two incoming signals $X_I$, $X_Q$ are interleaved. The first signal $X_I$ is assumed to represent a first quadrature-divided information-signal component, for instance an I-channel, of an underlying information signal, and the second signal $X_Q$ is assumed to represent a second quadrature-divided information-signal component, for instance a Q-channel, of the same underlying information signal. The first signal $X_I$ is received by a first sigma-delta modulator 16010 and the second signal $X_Q$ is received by a second sigma-delta modulator 16020.

The first sigma-delta modulator 16010 generates a first digital signal $Y_I$ and the second sigma-delta modulator 16020 generates a second digital signal $Y_Q$. The digital signals $Y_I$, $Y_Q$ are also delivered to a mixing and amplifying unit 16030 interleaved, in accordance with the first and second embodiment of the invention. A synchronising signal CL is transferred from the mixing and amplifying unit 16030 to the sigma-delta modulators 16010, 16020, to ensure that these modulators operate synchronously with the mixing and amplifying unit 16030.

The mixing and amplifying unit 16030 delivers two interleaved voltage-switched signals $P_I$, $P_Q$, which are filtered in a filtering unit 16040. Filtration of the signals results in a band-limited signal $P_{iq-bp}$ that includes a given signal spectrum.

Figure 17:
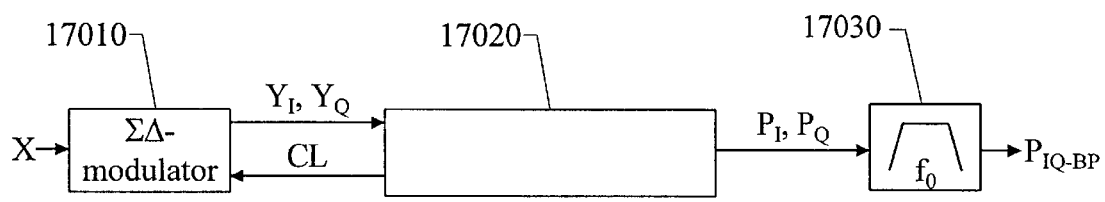
FIG. 17 is a block schematic illustrating an arrangement for dividing a general information signal into quadrature signal components which are pulse-shaped and power amplified in accordance with a sixth embodiment of the proposed method.

FIG. 17 is a block schematic illustrating a sixth embodiment of an inventive pulse-shaping and power-amplifying arrangement. An incoming signal X is modulated in a sigma-delta modulator 17010 to form a first $Y_I$ and a second $Y_Q$ quadrature-divided digital signal component. The digital signals $Y_I$, $Y_Q$ are delivered interleaved to a mixing and amplifying unit 17020 in accordance with the first or the second embodiment of the invention. A synchronising signal CL is sent to the sigma-delta modulator 17010 from the mixing and amplifying unit 17020, to ensure that the entire system operates synchronously.

The mixing and amplifying unit 17020 delivers to interleaved voltage-switched signals $P_I$, $P_Q$, which are filtered in a filtering unit 17030. Filtering of these signals results in a band-limited signal $P_{IQ-BP}$ which includes a given signal spectrum.

What is claimed is:

1. An arrangement for pulse-shaping and power-amplifying an information signal ($X_{IF}$), comprising:

a sigma-delta modulator (410, 11410) for generating a digital signal (Y) from the information signal ($X_{IF}$);

a mixing and amplifying unit (420, 11420) for forming a voltage-switched information-carrying signal (P) from the digital signal (Y); and a filtering unit (430, 11430) for generating a band-limited signal ($P_{BP}$) from the voltage switched signal (P), wherein;

the digital signal (Y) is M-ary and;

the mixing and amplifying unit (420, 11420) includes a switch unit (423) which includes at least M mutually independent switches (5330, 5340 and 12310, 12320 respectively) which are used to generate the information-carrying signal (P).

2. An arrangement for pulse-shaping and power-amplifying two quadrature-divided information signal components ($X_I$ and $X_Q$ respectively) comprising:

a first sigma-delta modulator (14010) for generating a first digital signal ($Y_I$) from the first information signal component ($X_I$);

a second sigma-delta modulator (14020) for generating a second digital signal ($Y_Q$) from the second information signal component ($X_Q$);

a first mixing and amplifying unit (14030) for forming a first voltage-switched information-carrying signal ($P_I$) from the first digital signal ($Y_I$);

a second mixing and amplifying unit (14040) for forming a second voltage-switched information-carrying signal ($P_Q$) from the second digital signal ($Y_Q$);

a phase-shifting unit (14050) for generating from a first symbol sequence (B) generated in said first mixing and amplifying unit (14030); a second bit sequence ($B_{\pi/2}$) phase-shifted in relation to the first symbol sequence (B) to said second mixing and amplifying unit (14040);

a summation unit (14060) for forming a summation signal ($P_{IQ}$) from said first ($P_I$) and said second ($P_Q$) voltage-switched signals; and a filtering unit (14070) for generating a band limited signal ($P_{IQ}$) from the summation signal ($P_{IQ\text{-}BP}$), wherein;

said respective digital signals ($Y_I$ and $Y_Q$) are M-ary and;

said respective mixing and amplifying units (14030 and 14040) each include a switch unit (423, 11423) that includes at least M switches which are used to generate the respective;

voltage switched signals ($P_I$ and $P_Q$ respectively).

3. An arrangement for pulse-shaping and power-amplifying an information signal (X) comprises:

a sigma-delta modulator (15010) for generating a first ($Y_I$) and a second ($Y_Q$) quadrature-divided digital signal component from the information signal (x);

a first mixing and amplifying unit (15020) to form a first voltage-switched information-carrying signal ($P_I$) from the first digital signal component ($Y_I$);

a second mixing and amplifying unit (15030) for forming a second voltage-switched information-carrying signal ($P_Q$) from the second digital signal component ($Y_Q$);

a phase-shifting unit (15040) for delivering to the second mixing and amplifying unit (15030) a second symbol sequence ($B_{\pi/2}$) taken from a first symbol sequence (B) generated in said first mixing and amplifying unit (15020), said second symbol sequence being phase-shifted in relation to the first symbol sequence (B);

a summation unit (15050) for forming a summation signal ($P_{IQ}$) from said first ($P_I$) and said second $P_Q$) voltage switched signals; and a filter unit (15060 for generating a band-limited signal ($P_{IQ}$) from the summation signal ($P_{IQ\text{-}BP}$), wherein;

respective digital signal components ($Y_I$ and $Y_Q$) are M-ary and;

respective mixing and amplifying units (15020 and 15030) each includes a switch unit (423, 11423) that includes at least M switches which are used in generating the respective voltage switched signals ($P_I$and $P_Q$).

4. An arrangement according to claim 1, wherein said M switches (5330, 5340) are conductive elements (5330, 5340) whose electrical conductivity is contingent on the amount of ionising radiation that falls on said elements.

5. An arrangement according to claim 4, wherein said conductive elements (5330,5340) are photoconductive elements.

6. An arrangement according to claim 5, wherein said photoconductive elements (5330, 5340) are at least one of transistors, thyristors and diodes having conductivity that can be influenced with the aid of ionising radiation.

7. An arrangement according to claim 5, wherein said photoconductive elements (5330, 5340) are made of gallium arsenide.

8. An arrangement according to claim 5, wherein said photoconductive elements (5330, 5340) are made of gold doped silicon.

9. An arrangement according to claim 5, wherein said photoconductive elements (5330, 5340) are made of copper doped silicon.

10. An arrangement according to claim 4, wherein an electrical conductivity of said conductive elements (5330, 5340) is contingent on an amount of incident electromagnetic energy having X-ray wavelength.

11. An arrangement according to claim 4, wherein an electrical conductivity of said conductive elements (5330, 5340) can be influenced by free electrons falling on said conductive elements (5330, 5340) and generating a plurality of free charge carriers in said conductive elements (5330, 5340).

12. A method of pulse-shaping and power-amplifying an information signal ($Y_{IF}$) comprising the steps of:

sigma-delta modulating (410) the information signal ($X_{IF}$), thereby to form a digital signal (Y);

mixing (421) the digital signal (Y) with a symbol sequence (B) to generate a radio frequency signal (RF);

decoding (422) the radio frequency signal (RF) depending on the prevailing information content of the digital signal (Y);

switching (423) the radio frequency signal (RF) to form a voltage-switched information-carrying signal (P); and filtering (430) the voltage switched signal (P) to generate a band limited signal ($P_{BP}$), wherein;

the digital signal (Y) is M-ary; and the voltage switched signal (P) is formed from the radio frequency signal (R-F) with the aid of at least M switches (5330, 5340), each of which controls an electric magnitude (+U and –U respectively).

13. A method according to claim 12, further comprising the step of:

converting the radio frequency signal (RF) to ionising radiation ($o_1$, $o_2$); wherein said switches are conductive elements (5330, 5340) having an electric conductivity that is contingent on the ionising radiation incident on said elements.

14. A method of pulse-shaping and power-amplifying an information signal ($X_{IF}$) comprising the steps of:

sigma-delta modulating (11410) the information signal ($X_{IF}$), thereby forming a digital signal (Y);

decoding (11422) the digital signal (Y) in dependence on the prevailing information content of the signal (Y);

up-mixing (11421) the digital signal (Y), therewith generating a radio frequency signal ($c_1$, $c_2$);

switching (11423) the radio frequency signal ($c_1$, $c_2$), therewith forming a voltage-switched information-carrying signal (P); and filtering (11430) the voltage-switched signal (P), thereby generating a band-limited signal ($P_{BP}$), wherein;

the digital signal (Y) is M-ary; and the up-mixing of the digital signal (Y) includes the steps of generating a pulse (12110, 12120), converting said pulse to ionising radiation ($o_1$, $o_2$); dividing (12150, 12160) said ionising radiation into at least two components which are transmitted via at least two delay elements (12170–12177) having mutually different signal delays and combination;

(12180, 12190) of said components to pulse trains ($c_1$, $c_2$) wherein further said pulse trains ($c_1$, $c_2$) irradiate one given conductive element (12310, 12320) of M possible elements, an electric conductivity of said conductive elements being contingent on an ionising radiation ($c_I$, $c_2$) incident on said elements, and an electric magnitude (+U, −U) is controlled with the aid of said conductive elements (12310, 12320).

15. A method of pulse-shaping and power-amplifying two quadrature-divided information signal components ($X_I$ and $X_Q$ respectively) comprising sigma-delta modulating (14010) the first information signal component ($X_I$) to form a first digital signal ($Y_I$);

sigma-delta modulating (14020) the second information signal component ($X_Q$) to form a second digital signal ($Y_Q$);

separately mixing and switching (14030, 14040) the first ($Y_I$) and the second ($Y_Q$) digital signals to generate two voltage-switched information-carrying signals ($P_I$ and $P_Q$ respectively);

combining (14060) the voltage-switched signals ($P_I$, $P_Q$) to form a summation signal ($P_{IQ}$); and filtering (14070) the summation signal ($P_{IQ}$) to form a band-limited signal ($P_{IQ}$-$B_p$), wherein the digital signals ($Y_I$, $Y_Q$) are M-ary and said switching (14030 and 14040 respectively) is effected with the aid of at least M switches, each of which controls an electric magnitude (+U, −U).

16. A method of pulse-shaping and power-amplifying an information signal (X) comprising:

sigma-delta modulating (15010) the information signal (x) to form a first ($Y_I$) and a second ($Y_Q$) digital signal;

separately mixing and switching (15020, 15030) the respective first ($Y_I$) and second ($Y_Q$) digital signals to generate two voltage-switched information-carrying signals ($P_I$, $P_Q$);

combining (15050) the voltage-switched signals ($P_I$, $P_Q$) to form a summation signal ($P_{IQ}$); and filtering (15060) the summation signal ($P_{IQ}$) to form a band-limited signal ($P_{EQ\text{-}BP}$), wherein said digital signals ($Y_I$, $Y_Q$) are M-ary and said switching (15020 and 15030 respectively) is effected with the aid of at least M switches of which each controls an electric magnitude (+U, −U).

17. A method according to claim 15, wherein said switches are conductive elements (5330, 5340) having an electric conductivity that is contingent on an ionising radiation incident on said elements.

18. A method according to claim 13, wherein said ionising radiation is electromagnetic energy having light wavelength; and said conductive element (5330, 5340, 12310, 12320) is photoconductive.

19. A method according to claim 13, wherein said ionising radiation is electromagnetic energy having X-ray wavelength.

20. A method according to claim 13, wherein said ionising radiation is comprised of free electrons.

\* \* \* \* \*